US 6,600,372 B2

(12) United States Patent
Prentice

(10) Patent No.: US 6,600,372 B2
(45) Date of Patent: Jul. 29, 2003

(54) ATTENUATOR CONTROL CIRCUIT

(75) Inventor: John S. Prentice, Palm Bay, FL (US)

(73) Assignee: Intersil Americas Inc., Milpitas, CA (US)

(*) Notice: Subject to any disclaimer, the term of this patent is extended or adjusted under 35 U.S.C. 154(b) by 0 days.

(21) Appl. No.: 10/007,479

(22) Filed: Dec. 3, 2001

(65) Prior Publication Data

US 2002/0079967 A1 Jun. 27, 2002

Related U.S. Application Data

(60) Provisional application No. 60/258,176, filed on Dec. 22, 2000.

(51) Int. Cl.[7] .............................................. H03F 3/45
(52) U.S. Cl. ........................ 330/254; 330/257; 330/284
(58) Field of Search ............................. 330/254, 257, 330/284

(56) References Cited

U.S. PATENT DOCUMENTS

| 4,379,995 | A | | 4/1983 | Yamada et al. | |
|---|---|---|---|---|---|
| 4,625,131 | A | | 11/1986 | Kasperkovitz et al. | |
| 4,695,806 | A | * | 9/1987 | Barrett | 330/254 |
| 5,157,350 | A | * | 10/1992 | Rubens | 330/254 |
| 5,302,868 | A | * | 4/1994 | Fergus | 327/359 |
| 5,684,431 | A | * | 11/1997 | Gilbert et al. | 330/254 |
| 5,880,631 | A | * | 3/1999 | Sahota | 330/51 |
| 5,936,465 | A | | 8/1999 | Kimura | |
| 5,999,053 | A | * | 12/1999 | Eschauzier | 330/254 |
| 6,249,170 | B1 | * | 6/2001 | Main et al. | 327/350 |

FOREIGN PATENT DOCUMENTS

| DE | 40 42 047 A 1 | 7/1991 |
|---|---|---|
| EP | 08167241 | 6/1996 |

OTHER PUBLICATIONS

PCT Notification of Transmittal of the International Search Report or the Declaration, dated Jun. 18, 2002, 7 pages.

* cited by examiner

Primary Examiner—Michael Tokar
Assistant Examiner—Linh Van Nguyen
(74) Attorney, Agent, or Firm—Gary R. Stanford

(57) ABSTRACT

An attenuator control circuit for controlling operation of a differential pair attenuator to provide linear in decibels (dB) operation and temperature and process-independent operation. The attenuator control circuit is coupled in parallel with corresponding control input terminals of the attenuator differential pair. The attenuator control circuit also includes a current control circuit that sources a supply current to the control differential pair. The attenuator control circuit also includes an amplifier that controls current through the first current path of the control differential pair to maintain constant total current, so that the first current path exhibits the desired exponential attenuation function. Since the control differential pair is coupled in parallel with the differential pair attenuator, the output current of the differential pair attenuator also exhibits the desired exponential attenuation function. Furthermore, the attenuator control circuit includes a temperature compensation circuit that applies a temperature proportional voltage to compensate for temperature variations.

16 Claims, 4 Drawing Sheets

ATTENUATOR CONTROL CIRCUIT

CROSS-REFERENCE TO RELATED APPLICATION(S)

The present application is based on U.S. Provisional Patent Application entitled "Attenuator Control Circuit", Ser. No. 60/258,176, filed Dec. 22, 2000, which is hereby incorporated by reference in its entirety. The present application is related to U.S. patent application entitled "A Calibrated DC Compensation System For A Wireless Communication Device Configured In A Zero Intermediate Frequency Architecture", Ser. No. 09/677,975, filed Oct. 2, 2000, which is hereby incorporated by reference in its entirety.

FIELD OF THE INVENTION

The present invention relates to differential pair attenuation and control circuits and techniques, and more particularly to an attenuator control circuit and a temperature compensation circuit for controlling and stabilizing operation of a differential pair attenuator.

DESCRIPTION OF RELATED ART

The bipolar junction transistor (BJT) differential pair is often used as the key element in an attenuator or automatic gain control (AGC) amplifier. The input signal, in the form of a current, is injected at the common emitters (emitters connected together) of the BJT differential pair. The output signal, also in the form of a current, is derived from the collector of one of the transistors. The difference in base voltages between the differential pair determines the ratio of output signal current to input signal current.

The attenuation function often needs to be linear in decibels (dB) and invariant with temperature and process variations. If the attenuator is to be "linear in dB", then the collector current, referred to as $I_C$, of one of the differential pair must vary (increase/decrease) exponentially with a linear change in control voltage. The collector current is constrained, however, to a maximum bias current, referred to as $I_{BIAS}$, provided by a constant current sink coupled between the emitter terminals of the differential pair and ground. For some large positive value for the voltage differential between the base voltages of the differential pair, referred to as $V_D$, the ratio of the output current to the input current is one-to-one (1:1). For a range of large negative $V_D$, the current $I_C$ typically does vary exponentially with linear changes of $V_D$. For small values of $V_D$, however, the current does not respond exponentially. It is also noted that a thermal coefficient voltage, referred to as $V_T$, gives the transfer function a temperature dependence. The thermal coefficient voltage $V_T$ is the voltage equivalent of temperature, where $V_T = kT/q$, where "k" is the Boltzmann constant in joules per degree Kelvin, T is the temperature in degrees Kelvin (absolute scale), and "q" is the magnitude of the charge of an electron. Simply applying the input gain control voltage between the bases of the differential pair, therefore, does not result in a temperature independent, "linear in dB" response as desired.

SUMMARY OF THE INVENTION

An attenuator control circuit according to an embodiment of the present invention controls operation of a differential pair attenuator to provide linear in decibels (dB) operation. The differential pair attenuator includes first and second control input terminals that collectively receive a control voltage which is intended to control the attenuation of output current of the differential pair attenuator. In one configuration, an input current signal is injected at the common emitters of the differential pair and an output current signal is developed at the collector of one of the transistors. The output collector is coupled to a supply voltage through a resistor. The difference in base voltages between the differential pair determines the ratio of output signal current to input signal current. It is desired that the attenuation function be linear in dB and invariant with temperature and process variations. The differential pair attenuator alone, however, does not meet the desired attenuation function in certain circumstances, such as when the control voltage is small or large and positive. Also, the differential pair attenuator is dependent upon temperature and process variations.

The attenuator control circuit corrects for these deficiencies of the differential pair attenuator. The attenuator control circuit includes first and second transistors forming a control differential pair that is biased by a bias current. The control differential pair has first and second current paths and first and second current control terminals, where the first and second current control terminals are coupled to the respective first and second control input terminals of the attenuator differential pair. The attenuator control circuit also includes a current control circuit that sources a supply current to the first and second current paths of the control differential pair, where the supply current is approximately equal to the bias current. The attenuator control circuit also includes an amplifier that has an input coupled to the current control circuit and an output coupled to the second control terminal of the control differential pair. The amplifier controls current through the second current path of the control differential pair and attempts to maintain constant total current through the first and second current paths. In one embodiment, the constant total current through the first and second current paths is approximately the same as the bias current. Since the total current through the control differential pair is kept constant by controlling one current path of the control differential pair, the other current path of the control differential pair exhibits the desired exponential attenuation function. Since the control differential pair is coupled in parallel with the differential pair attenuator, the output current of the differential pair attenuator also operates according to the desired exponential attenuation function.

The current control circuit may include a bias current circuit and a current mirror. The current mirror has an input coupled to the bias current circuit and an output coupled to the first and second current paths of the control differential pair. In this manner, the current mirror applies the same current developed by the bias control circuit to the current paths of the control differential pair. In one embodiment, the amplifier is a non-inverting amplifier that has its input coupled to the output of the current mirror. In an alternative embodiment, the amplifier is an inverting amplifier that has its input coupled to the input of the current mirror. Operation is similar in either case. The attenuator bias current circuit may include a bias current sink and a third transistor, where the third transistor has a control terminal and first and second current terminals. The control terminal of the third transistor is coupled to the first current control terminal of the control differential pair. Also, the first current terminal is coupled to the input of the current mirror and the second current terminal is coupled to the bias current sink.

In a more specific embodiment, the first, second and third transistors are matched bipolar junction transistors having common emitters coupled to a bias current circuit that sinks approximately twice the bias current. Furthermore, the attenuator control circuit may include a temperature compensation circuit coupled between the control terminal of the third transistor and the first current control terminal of the control differential pair. The temperature compensation circuit is a suitable fixed bias voltage circuit that applies a temperature proportional voltage between the control terminal of the third transistor relative and the first current control terminal of the control differential pair. The temperature compensation circuit operates to counteract the temperature dependence of the attenuator control circuit and the differential pair attenuator.

In one embodiment, the temperature compensation circuit includes first and second differential-to-single-ended stages, each having a differential input and an output. A first polarity of the differential input of the first stage is coupled to a first polarity of the differential input of the second stage forming a feedback node. A reference signal is applied to a second polarity of the differential input of each of the first and second differential-to-single-ended stages. A temperature independent current sink is coupled to bias the first differential-to-single-ended stage and a temperature proportional current sink is coupled to bias the second differential-to-single-ended stage. Further, a current circuit is coupled to the output of the first differential-to-single-ended stage, where the current circuit draws a temperature independent current. An amplifier is provided with an input coupled to the output of the first differential-to-single-ended stage and an output coupled to the feedback node. Finally, the temperature compensation circuit includes an output circuit that applies the temperature proportional voltage.

In a more specific embodiment, an attenuator control circuit according to another embodiment includes first, second and third matched transistors coupled in a common emitter configuration. A current sink is coupled to the common emitters of the three transistors. The second and third transistors form a differential pair having first and second base terminals coupled to first and second base terminals, respectively, of the differential pair attenuator. The second transistor has a collector terminal that is coupled to a collector terminal of the third transistor. A current mirror is provided having a first current terminal coupled to a collector terminal of the first transistor and a second terminal coupled to the collector terminals of the second and third transistors. An amplifier has an input coupled to the current mirror and an output coupled to the base terminal of the third transistor. Finally, a voltage source is provided that applies a temperature proportional bias voltage between the base terminals of the first and second transistors.

The current mirror may include a first diode-coupled transistor coupled at its first current terminal to the collector terminal of the first transistor and a second transistor coupled at its second current terminal to the collector terminals of the second and third transistors of the common emitter configuration. In one embodiment, the amplifier is a non-inverting amplifier having its input coupled to the second current terminal of the current mirror. In an alternative embodiment, the amplifier is an inverting amplifier having its input coupled to the first current terminal of the current mirror.

The fixed bias voltage source may include first and second differential-to-single-ended stages, each having a differential input and an output. A first polarity of the differential input of the first stage is coupled to a first polarity of the differential input of the second stage at a feedback node. The fixed bias voltage source further includes a reference signal that is applied to a second polarity of the differential input of each of the first and second differential-to-single-ended stages. The fixed bias voltage source further includes a temperature independent current sink coupled to bias the first differential-to-single-ended stage, a temperature proportional current sink coupled to bias the second differential-to-single-ended stage, an attenuator input gain control current source coupled to the output of the first differential-to-single-ended stage, an amplifier having an input coupled to the output of the first differential-to-single-ended stage and an output coupled to the feedback node, and an output circuit coupled to the output of the second differential-to-single-ended stage that develops the fixed bias voltage.

BRIEF DESCRIPTION OF THE DRAWINGS

A better understanding of the present invention can be obtained when the following detailed description of embodiments of the invention is considered in conjunction with the following drawings, in which.

DETAILED DESCRIPTION OF EMBODIMENT (S) OF THE INVENTION

Figure 1:
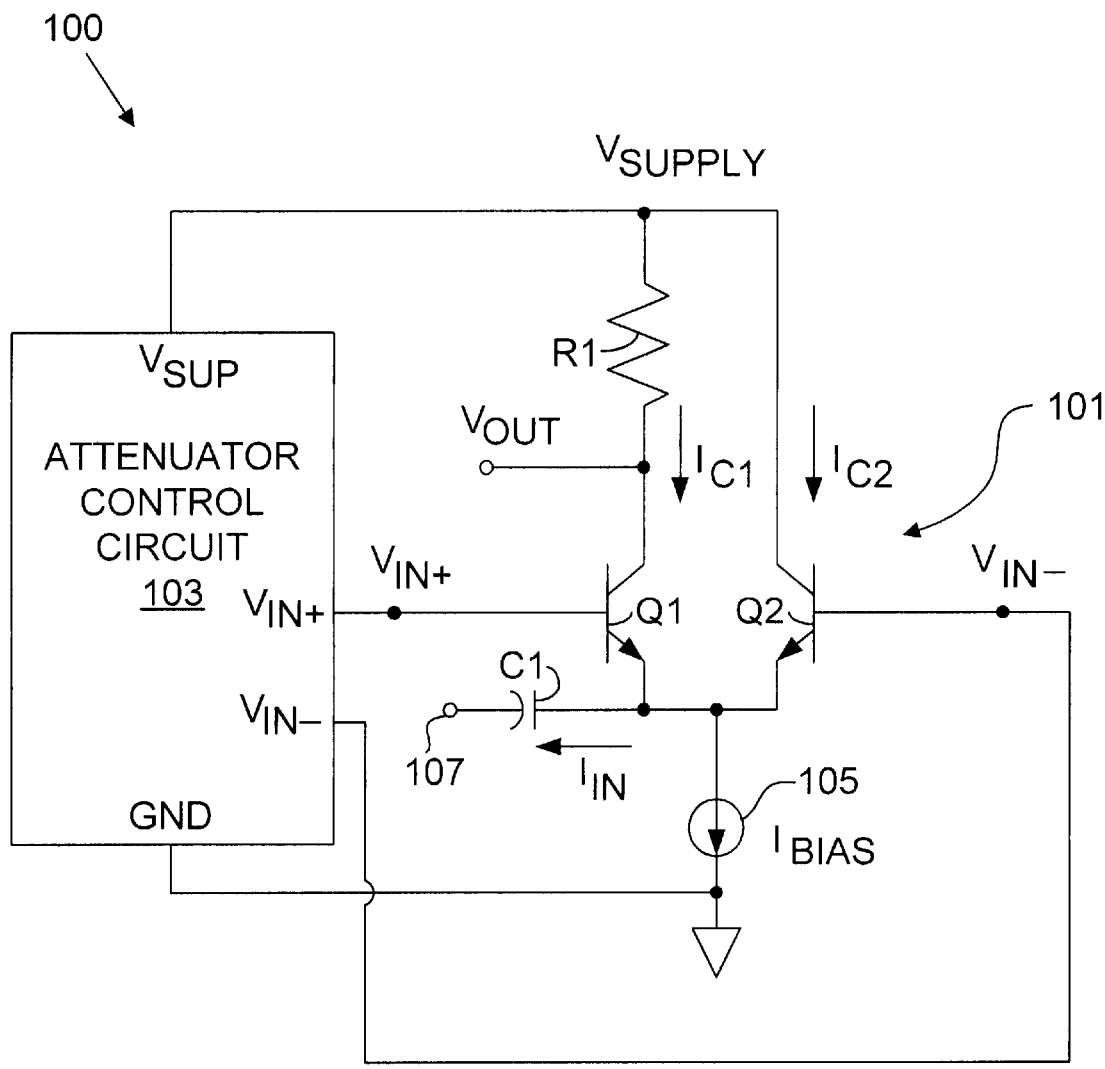
FIG. 1 is a schematic and block diagram of an attenuator circuit including an attenuator control circuit according to the present invention coupled to a differential pair attenuator.

FIG. 1 is a schematic and block diagram of an attenuator circuit 100 including an attenuator control circuit 103 according to the present invention coupled to a differential pair attenuator 101. The differential attenuator pair 101 includes a pair of transistors Q1 and Q2 coupled in a differential configuration. In the embodiment shown, the transistors Q1 and Q2 are NPN bipolar junction transistors (BJTs) having their emitters coupled together and to one terminal of a current sink 105. The other terminal of the current sink 105 is coupled to ground and sinks a bias current $I_{BIAS}$ from the emitters of the transistors Q1 and Q2 to ground. The collector of the transistor Q1 develops an output voltage $V_{OUT}$ and is coupled to one side of a resistor R1. The other side of the resistor R1 is coupled to a voltage supply signal referred to as $V_{Supply}$. The collector of the transistor Q2 is coupled to the $V_{Supply}$ signal. An input current $I_{IN}$ is sourced or sinked via a node 107, which is coupled to the emitter of the transistor Q1 through a coupling or DC blocking capacitor C1. The collector currents of the transistors Q1 and Q2 are $I_{C1}$ and $I_{C2}$, respectively.

Momentarily ignoring the attenuator control circuit 103 and neglecting base currents, the ratio of output to input signal currents of the differential pair attenuator 101 is equal to the ratio of the DC portion of $I_{C1}$ to $I_{BIAS}$ as illustrated in the following equation 1:

$$I_{C1}=I_{BIAS}/(1+\exp[-V_D/V_T]), V_D=V_{IN+}-V_{IN-} \qquad (EQ\ 1)$$

where $V_T$ is the thermal coefficient voltage. If the differential pair attenuator 101 is to be "linear in dB", then the collector current $I_{C1}$ varies (increases/decreases) exponentially with a linear change in control voltage $V_D$ but is constrained to a maximum value of $I_{BIAS}$. This is only true, however, for large negative values of $V_D$. Also the $V_T$ term gives the transfer function a temperature dependence. Therefore, simply applying the input gain control voltage between the bases of the transistors Q1 and Q2 does not result in a temperature independent, "linear in dB" response. It is noted that a single transistor, such as the transistor Q1, does have the required exponential current/voltage relationship as illustrated by the following equation 2:

$$I_{C1}=(I_S)\exp[V_{BE1}/V_T] \qquad \text{(EQ 2)}$$

where $I_S$ is a constant describing the transfer characteristic of the transistor Q1, "exp" is the exponential function base e (natural logarithm) and $V_{BE1}$ is the base to emitter voltage of the transistor Q1.

In a particular embodiment, an input radio frequency (RF) current $I_{IN}$ is applied at node 107 from an RF source with a relatively high output impedance, such as the collector of a BJT or the drain of a field effect transistor (FET). The RF source may be, for example, a previous RF stage such as an up converter mixer or the like used in RF communication devices. The differential pair Q1, Q2 operates as an attenuator block or as a signal current diverter. If the differential base voltages $V_{IN+}$ and $V_{IN-}$ are equal such that the control voltage $V_D$ is approximately zero, then the attenuation factor is 0.5 or –6 db. If, however, the control voltage is $2V_T$, then most of the current signal (~89% of $I_{BIAS}$) is developed as the output current $I_{C1}$ to achieve relatively low attenuation. As the control voltage $V_D$ becomes negative, very little signal comes out of the collector of the transistor Q1 so that the attenuation is large.

A reference voltage $V_{BEM}$ and a control voltage $V_{CNT}$ is defined in the following equation 3:

$$V_{BEM}=V_T \ln[I_{BIAS}/I_S], \quad V_{CNT}=cV_T \qquad \text{(EQ 3)}$$

where "c" is a unitless scale factor greater than or equal to zero (0) and "ln" is the logarithmic function base e. The desired exponential current function for the transistor Q1 is generated by substituting equation 3 into equation 2 as illustrated in the following equation 4:

$$V_{BE1}=(V_{BEM}-V_{CNT}), \quad I_{C1}=(I_S)\exp[(V_{BEM}-V_{CNT})/V_T]=(I_{BIAS}) \qquad \text{(EQ 4)}$$

The attenuator control circuit 103 applies a differential voltage between the bases of the transistors Q1 and Q2 such that the base-emitter voltage $V_{BE1}$ of the transistor Q1 as described by equation 2 would generate the desired collector current $I_{C1}$ as described also in equation 4.

Figure 2:
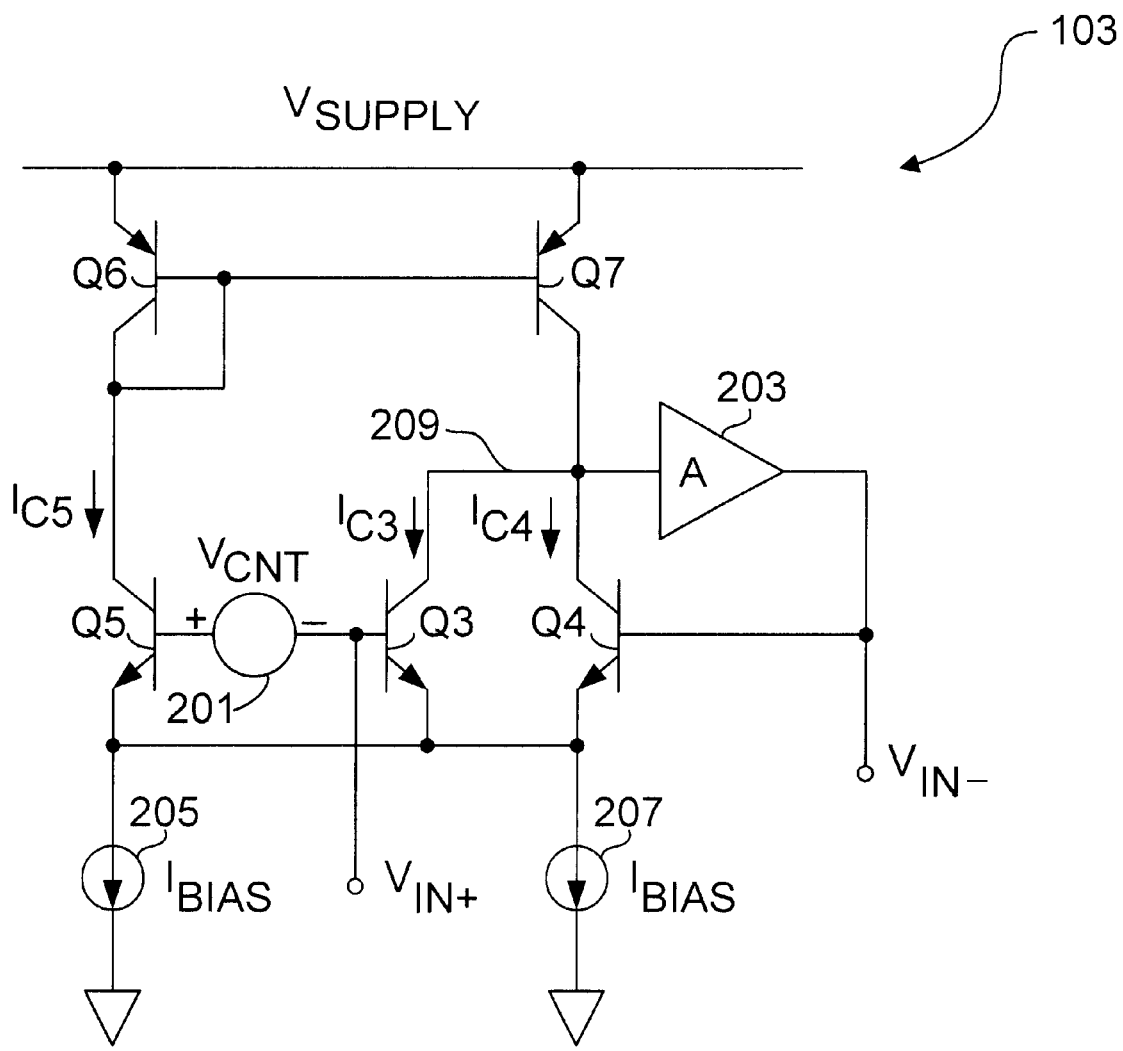
FIG. 2 is a schematic diagram illustrating an exemplary embodiment of the attenuator control circuit of FIG. 1.

FIG. 2 is a schematic diagram illustrating an exemplary embodiment of the attenuator control circuit 103. Three matched NPN, bipolar junction transistors Q3, Q4 and Q5 have their emitters connected together and to one end of two constant current sinks 205 and 207 each sinking a constant bias current $I_{BIAS}$ from the emitters. The other ends of the current sinks 205 and 207 are coupled to ground. The total emitter biasing current is $2I_{BIAS}$, which is shown as separate current sinks although a single current sink is also contemplated. The collectors of the transistors Q3 and Q4 are connected together at a node 209, which is coupled to the collector of a PNP bipolar junction transistor Q7 and to the input of a buffer or non-inverting amplifier (A) 203. The output of the amplifier 203 is coupled to the base of the transistor Q4 and develops a voltage $V_{IN-}$ for coupling to the $V_{IN-}$ node of the differential pair attenuator 101. The base of the transistor Q7 is coupled to the base and collector of another PNP bipolar junction transistor Q6. The base and collector of the transistor Q6 are coupled together and to the collector of the transistor Q5. The emitters of the transistors Q6 and Q7 are coupled to the $V_{Supply}$ signal. A temperature compensation circuit 201 generating the control voltage $V_{CNT}$ has its positive terminal coupled to the base of the transistor Q5 and its negative terminal coupled to the base of the transistor Q3. The base of the transistor Q3 develops a voltage $V_{IN+}$ for coupling to the $V_{IN+}$ node of the differential pair attenuator 101. The collector currents of the transistors Q3, Q4 and Q5 are $I_{C3}$, $I_{C4}$ and $I_{C5}$, respectively. The base to emitter voltages of the transistors Q3, Q4 and Q5 are $V_{BE3}$, $V_{BE4}$ and $V_{BE5}$, respectively.

The transistors Q6 and Q7 are configured to operate as a current mirror that adds a current approximately equal to $I_{C5}$ into the node 209 coupled to the collectors of the transistors Q3 and Q4. The output of the amplifier 203 drives the base of the transistor Q4 and the base of the transistor Q2 of the differential pair attenuator 101. The temperature compensation circuit 201 provides suitable fixed bias voltage for $V_{IN+}$ when coupled to the base of the transistor Q1 of the differential pair attenuator 101. The control voltage $V_{CNT}$, referenced to the $V_{IN+}$ voltage, is applied to the base of the transistor Q5, so that the base to emitter voltages of the transistors Q3 and Q5 are defined according to the following equations 5 and 6:

$$V_{BE3}=V_{BE5}-V_{CNT} \qquad \text{(EQ 5)}$$

$$V_{BE3}-V_{BE5}=-V_{CNT}=V_T \ln[I_{C3}/I_{C5}], \quad I_{C3}/I_{C5}=\exp[-V_{CNT}/V_T] \qquad \text{(EQ 6)}$$

In operation, the amplifier 203 adjusts the base voltage of Q4 to keep the sum of the collector currents ($I_{C3}+I_{C4}$) of the transistors Q3 and Q4 approximately equal to the collector current $I_{C5}$ of the transistor Q5 (provided by the current mirror Q6, Q7). In this manner, the collector current $I_{C5}$ of the transistor Q5 is maintained to be equal to one half of the total emitter current of the transistors Q3–Q5, or approximately equal to $I_{BIAS}$. Thus, the base to emitter voltage ($V_{BE5}$) and the collector current ($I_{C5}$) of the transistor Q5 are provided in accordance with the following equation 7:

$$V_{BE5}=V_T\ln[I_{BIAS}/I_S]=V_{BEM}, \quad I_{C5}=I_{BIAS} \qquad \text{(EQ 7)}$$

Solving equation 6 for $I_{C3}$ provides a relationship illustrated by the following equation 8:

$$I_{C3}=(I_{BIAS})\exp[-V_{CNT}/V_T] \qquad \text{(EQ 8)}$$

Equation 8 defines the desired functional "linear in dB" relationship. This relationship also applies to the attenuator differential transistor pair Q1 and Q2 since they have their bases connected in parallel with the bases of the transistors Q3 and Q4 when the attenuator control circuit 103 is coupled to the differential pair attenuator 101.

Figure 3:
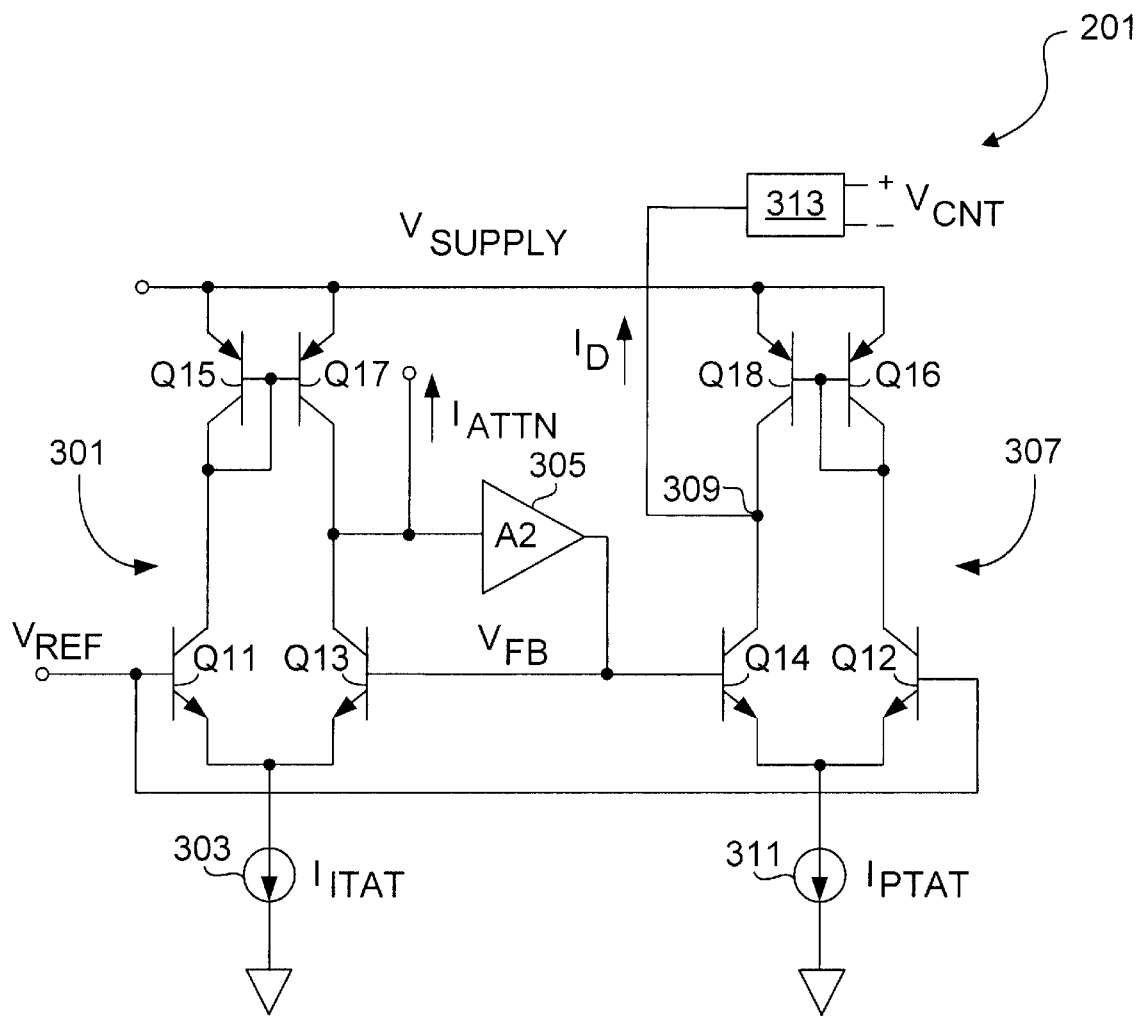
FIG. 3 is a schematic diagram illustrating an exemplary embodiment of a temperature compensation circuit that provides the control voltage of the attenuator control circuit of FIG. 2.

FIG. 3 is a schematic diagram illustrating an exemplary embodiment of the temperature compensation circuit 201 that provides the control voltage $V_{CNT}$ for the attenuator control circuit 103. The temperature compensation circuit 201 controls the control voltage $V_{CNT}$ to have a "proportional to absolute temperature" (PTAT) temperature coefficient to cancel the temperature coefficient voltage $V_T$ in equation 8 above. An attenuator input gain control voltage $V_{ATTN}$ is applied to a temperature independent resistor $R_{ATTN}$ (not shown) for developing a temperature independent attenuator control current $I_{ATTN}$. It is noted that many circuits and techniques are known to those having skill in the art for developing a current based on a control voltage applied to a resistor, so that such circuit is further illustrated. As an example, the input gain control voltage $V_{ATTN}$ may be applied to one end of the temperature independent resistor $R_{ATTN}$, which has its other end coupled to the input of a current mirror or the like. The output of the current mirror develops the $I_{ATTN}$ current proportional to $V_{ATTN}$. It is noted that $I_{ATTN}$ may further be level shifted if desired.

The $I_{ATTN}$ current is forced to flow into or out of a differential-to-single-ended stage 301. The differential-to-single-ended stage 301 includes a differential pair of NPN bipolar junction transistors Q11 and Q13 and a current mirror including PNP bipolar junction transistors Q15 and Q17. In particular, the emitters of the transistors Q15 and Q17 are coupled to the $V_{Supply}$ signal, their bases are coupled together and the base of the transistor Q15 is coupled to its collector. The collectors of the transistors Q15 and Q11 are coupled together and the collectors of the transistors Q17 and Q13 are coupled together. The emitters of the transistors Q11 and Q13 are coupled together and to one terminal of a current source 303, having its other terminal coupled to ground to sink a current $I_{ITAT}$ from the emitters to ground. The base of the transistor Q11 receives a suitable constant reference voltage $V_{REF}$ and the base of the transistor Q13 is coupled to a voltage node $V_{FB}$ (having voltage of $V_{FB}$).

In this manner, the differential pair Q11, Q13 is biased by a temperature independent current sink ($I_{ITAT}$) having a magnitude that is greater than the largest expected value of the temperature independent current $I_{ATTN}$. The $I_{ITAT}$ current is derived from a temperature independent voltage $V_{ITAT}$ placed across a temperature independent resistor $R_{ITAT}$ (not shown). Techniques for developing the IITAT current are well known and will not be further illustrated. A suitable example of such circuits is provided in chapter 4, section A4.3 of Paul Gray & Robert Meyer, "Analysis and Design of Analog Integrated Circuits", 2d ed., John Wiley & Sons, 1984 (Gray & Meyer). A buffer or non-inverting amplifier 305 (A2) has its input coupled to the collectors of the transistors Q13, Q17 and its output coupled to the $V_{FB}$ node. The amplifier 305 operates to stabilize the voltage node $V_{FB}$ on the base of Q13 such that the output current of the differential pair Q11, Q13 equals the input current $I_{ATTN}$ as illustrated by the following equation 9:

$$I_{ATTN}=(I_{ITAT})\tan h[(V_{REF}-V_{FB})/2V_T], I_{ATTN}=V_{ATTN}/R_{ATTN}, I_{ITAT}=V_{ITAT}/R_{ITAT} \quad (EQ\ 9)$$

where "tanh" is the hyperbolic tangent function.

A substantially identical differential-to-single-ended stage 307 includes NPN bipolar junction transistors Q12 and Q14 forming a differential pair coupled to PNP bipolar junction transistors Q16 and Q18 forming a current mirror. In particular, the emitters of the transistors Q16 and Q18 are coupled to the $V_{Supply}$ signal, their bases are coupled together and the base of the transistor Q16 is coupled to its collector. The collectors of the transistors Q18 and Q14 are coupled together at a node 309 and the collectors of the transistors Q16 and Q12 are coupled together. The emitters of the transistors Q11 and Q13 are coupled together and to one terminal of a current sink 311, having its other terminal coupled to ground to sink a current $I_{PTAT}$ from the transmitter emitters. The base of the transistor Q12 receives the $V_{REF}$ signal and the base of the transistor Q14 is coupled to a voltage node $V_{FB}$. An output current $I_D$ is shown flowing from (or into) the node 309.

The current sink 311 sinks a current that is proportional to absolute temperature. As an example, the thermal coefficient voltage $V_T$ is applied across a temperature independent of resistor $R_{PTAT}$ (not shown) to develop the $I_{PTAT}$ current that is pulled from the emitters of the transistors Q12 and Q14 to ground. Again, such circuits for developing the $I_{PTAT}$ current are well known and not further illustrated. Chapter 4, section A4.2 of Gray & Meyer (Id.) provides examples of such circuitry. The following equation 10 illustrates the output current ID and the temperature proportional current $I_{PTAT}$ assuming that the voltages of the differential pair are substantially identical:

$$I_D=(I_{PTAT})\tan h[(V_{REF}-V_{FB}/2V_T)], I_{PTAT}=V_T/R_{PTAT} \quad (EQ\ 10)$$

Solving equation 9 for $(V_{REF}-V_{FB})$ and substituting into equation 10 yields the following equation 11 for defining the output current:

$$I_D=(I_{PTAT})(I_{ATTN}/I_{ITAT})=[(V_T)(V_{ATTN})/(V_{ITAT})](R_{ITAT}/R_{ATTN}R_{PTAT}) \quad (EQ\ 11)$$

In this manner, the output current $I_D$ is proportional to both the attenuator input gain control voltage $V_{ATTN}$ and the thermal voltage $V_T$. The control voltage $V_{CNT}$ is generated by applying the output current $I_D$ through a resistor $R_{CNT}$ connected to the reference voltage $V_{IN+}$ as illustrated by the following equation 12:

$$V_{CNT}=R_{CNT}I_D=[(V_T)(V_{ATTN})/(V_{ITAT})](R_{CNT}R_{ITAT}/R_{ATTN}R_{PTAT}) \quad (EQ\ 12)$$

A circuit 313 receives the output current $I_D$ and generates the $V_{CNT}$ voltage signal. Circuits for generating a voltage based on a current and corresponding resistor are well known and will not be further illustrated. Substituting equation 12 into equation 8 yields the following equation 13 for defining the collector currents $I_{C1}$ and $I_{C3}$:

$$I_{C3}=I_{C1}=(I_{BIAS})\exp[-[(V_{ATTN})/(V_{ITAT})](R_{CNT}R_{ITAT}/R_{ATTN}R_{PTAT})] \quad (EQ\ 13)$$

In this manner, the attenuator output current $I_{C1}$ is scaled exponentially by the attenuator input control voltage $V_{ATTN}$. Reference voltages and resistor ratios set the scale factor.

Many variations of the embodiments described above are contemplated. For example, the transistor emitter area ratios may be other than 1:1. The currents generated by the current sinks (e.g., 105, 205, 207, 303, 305) may be scaled by any desired scaling factor. The attenuator control circuit 103 (including the temperature compensation circuit 201) may be used to drive more than one differential pair attenuator (i.e. two attenuators for differential circuits). The current mirrors comprising the transistor pairs Q6 and Q7, Q15 and Q17, Q16 and Q18 may be implemented with any suitable current mirror circuitry other than that shown. Also, other types of transistors, such as positive channel metal oxide semiconductor (PMOS) transistors or the like, may be utilized to implement the current mirrors. It is also noted that the relative polarity of the $I_D$ and $I_{ATTN}$ currents may be switched by reversing the base connections of Q12 and Q14. In particular, the $V_{REF}$ voltage is applied instead to the base of the transistor Q14 and the voltage node $V_{FB}$ is coupled to the base of the transistor Q12.

Figure 4:
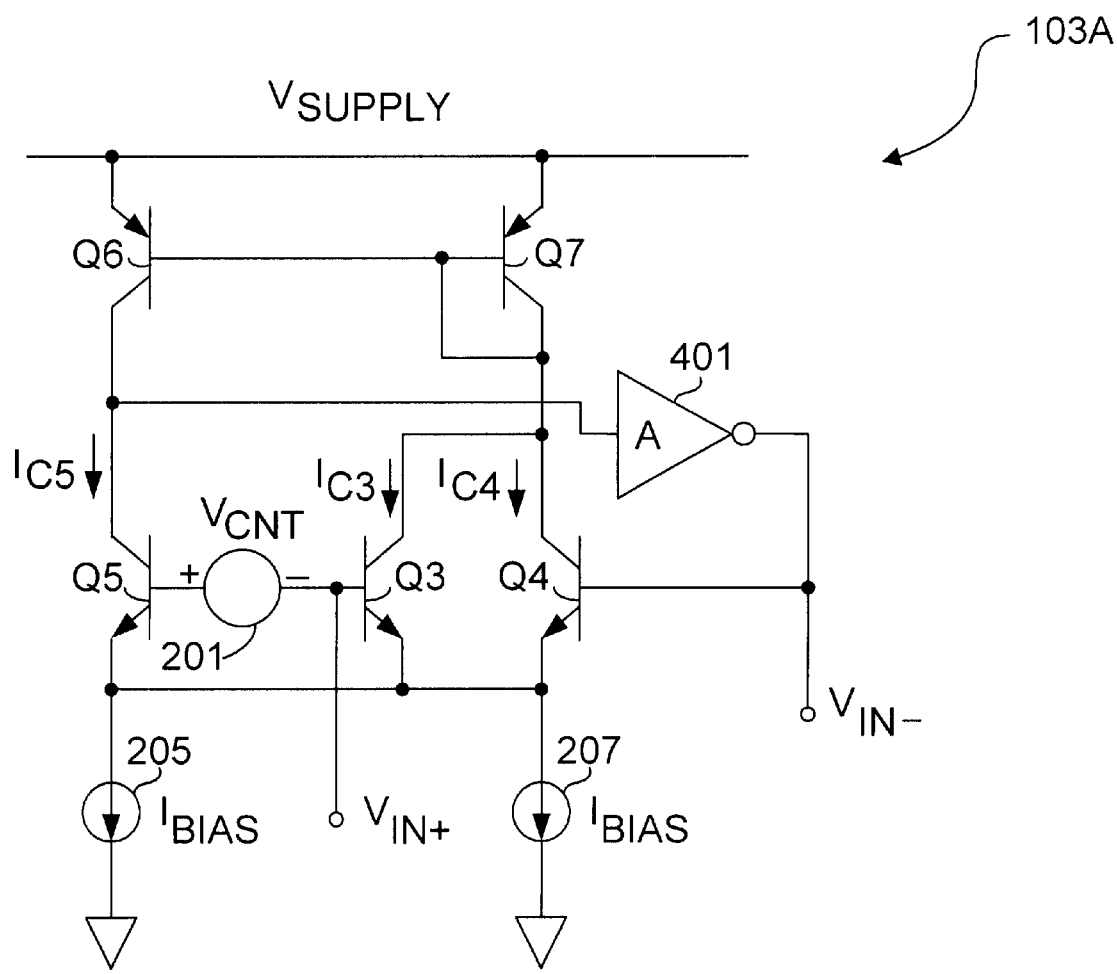
FIG. 4 is a schematic diagram illustrating an alternative embodiment of the attenuator control circuit of FIG. 2.

FIG. 4 is a schematic diagram illustrating an alternative embodiment of the attenuator control circuit 103, referred to as the attenuator control circuit 103A, where similar components have identical reference numbers. The current mirror formed by the transistors Q6 and Q7 are reversed, where the diode connection of the transistor Q6 is removed and the transistor Q7 is diode-coupled. In particular, the base of the transistor Q7 is coupled to its emitter. The amplifier 203 is replaced with an inverting amplifier 401 having its input coupled to the collectors of the transistors Q5 and Q6. Operation is similar.

Although a system and method according to the present invention has been described in connection with one or more embodiments, it is not intended to be limited to the specific form set forth herein, but on the contrary, it is intended to cover such alternatives, modifications, and equivalents, as can be reasonably included within the spirit and scope of the invention.

What is claimed is:

1. An attenuator control circuit for controlling operation of an attenuator, the attenuator comprising a differential pair with first and second control input terminals, the attenuator control circuit comprising:

first and second transistors forming a control differential pair, the control differential pair biased by a bias current and having first and second current input terminals coupled together at a current node, first and second current output terminals coupled together, and first and second current control terminals coupled to the first and second control input terminals of the attenuator differential pair, respectively;

a current control circuit that sources a supply current to the first and second current input terminals of the control differential pair, the supply current approximately equal to the bias current; and an amplifier, having an input coupled to the current control circuit and an output coupled to the second control terminal of the control differential pair, that controls current into the second current input terminal of the control differential pair to maintain constant total current through the control differential pair.

2. The attenuator control circuit of claim 1, wherein the constant total current through the control differential pair is approximately equal to the bias current.

3. The attenuator control circuit of claim 1, wherein the current control circuit comprises:

a bias current circuit; and a current mirror having an input coupled to the bias current circuit and an output coupled to the current node of the control differential pair.

4. The attenuator control circuit of claim 3, wherein the amplifier comprises a non-inverting amplifier having its input coupled to the output of the current mirror.

5. The attenuator control circuit of claim 3, wherein the amplifier comprises an inverting amplifier having its input coupled to the input of the current mirror.

6. The attenuator control circuit of claim 3, the wherein the bias current circuit comprises:

a bias current sink; and a third transistor having a control terminal and first and second current terminals, wherein the control terminal is coupled to the first current control terminal of the control differential pair, wherein the first current terminal is coupled to the input of the current mirror, and wherein the second current terminal is coupled to the bias current sink.

7. The attenuator control circuit of claim 6, wherein the first, second and third transistors are matched bipolar junction transistors having common emitters coupled to a bias current circuit that sinks approximately twice the bias current.

8. The attenuator control circuit of claim 6, further comprising:

a temperature compensation circuit coupled between the control terminal of the third transistor and the first current control terminal of the control differential pair.

9. The attenuator control circuit of claim 8, wherein the temperature compensation circuit applies a temperature proportional voltage.

10. The attenuator control circuit of claim 8, wherein the temperature compensation circuit comprises:

first and second differential-to-single-ended stages, each having a differential input and an output, wherein a first polarity of the differential input of the first stage forms a feedback node that is coupled to a first polarity of the differential input of the second stage;

a reference signal applied to a second polarity of the differential input of each of the first and second differential-to-single-ended stages;

a temperature independent current sink coupled to bias the first differential-to-single-ended stage;

a temperature proportional current sink coupled to bias the second differential-to-single-ended stage;

a current circuit coupled to the output of the first differential-to-single-ended stage that draws a temperature independent current;

an amplifier having an input coupled to the output of the first differential-to-single-ended stage and an output coupled to the feedback node; and an output circuit coupled to the output of the second differential-to-single-ended stage that applies a temperature proportional voltage between the control terminal of the third transistor and the first current control terminal of the control differential pair.

11. An attenuator control circuit that applies a differential control input to the control signal inputs of a differential pair attenuator, comprising:

first, second and third matched transistors coupled in a common emitter configuration;

a current sink coupled to the common emitters of the first, second and third transistors;

the second and third transistors forming a differential pair having first and second base terminals coupled to first and second base terminals, respectively, of the differential pair attenuator, the second and third transistors each having a collector terminal coupled to each other;

a current mirror having a first current terminal coupled to a collector terminal of the first transistor and a second terminal coupled to the collector terminals of the second and third transistors;

an amplifier having an input coupled to the current mirror and an output coupled to the base terminal of the third transistor; and a voltage source that applies a fixed bias voltage between the base terminals of the first and second transistors.

12. The attenuator control circuit of claim 11, wherein:

the current mirror comprises a pair of transistors including a first diode-coupled transistor coupled at its first current terminal to the collector terminal of the first transistor of the common emitter configuration and a second transistor coupled at its second current terminal to the collector terminals of the second and third transistors of the common emitter configuration; and wherein the amplifier comprises a non-inverting amplifier having an input coupled to the second current terminal of the current mirror.

13. The attenuator control circuit of claim 11, wherein:

the current mirror comprises a pair of transistors including a first diode-coupled transistor coupled at its first current terminal to the collector terminal of the first transistor of the common emitter configuration and a second transistor coupled at its second current terminal to the collector terminals of the second and third transistors of the common emitter configuration; and wherein the amplifier comprises an inverting amplifier having an input coupled to the first current terminal of the current mirror.

14. The attenuator control circuit of claim 11, wherein the fixed bias voltage source comprises:

first and second differential-to-single-ended stages, each having a differential input and an output, wherein a first polarity of the differential input of the first stage is coupled to a first polarity of the differential input of the second stage at a feedback node;

a reference signal applied to the second polarities of the differential input of the first and second differential-to-single-ended stages;

a temperature independent current sink coupled to bias the first differential-to-single-ended stage;

a temperature proportional current sink coupled to bias the second differential-to-single-ended stage;

an attenuator input gain control current source coupled to the output of the first differential-to-single-ended stage;

an amplifier having an input coupled to the output of the first differential-to-single-ended stage and an output coupled to the feedback node; and an output circuit coupled to the output of the second differential-to-single-ended stage that develops the fixed bias voltage.

15. The attenuator control circuit of claim 14, wherein the fixed bias voltage source further comprises:

the first and second differential-to-single-ended stages comprising matched stages, each including a current mirror and differential pair of transistors with common emitters;

a voltage source applying the reference signal to a base terminal of a first of each differential pair of transistors of the first and second differential-to-single-ended stages;

the temperature independent current sink coupled to the emitter terminals of the differential pair of transistors of the first differential-to-single-ended stage;

the temperature proportional current sink coupled to emitter terminals of the differential pair of transistors of the second differential-to-single-ended stage;

the attenuator input gain control current source providing an attenuator current to a collector terminal of a second of the differential pair of transistors of the first differential-to-single-ended stage;

the amplifier having an input coupled to the collector terminal of the second of the differential pair of transistors of the first differential-to-single-ended stage and an output coupled to a base terminal of a second of the differential pair of transistors of both of the first and second differential-to-single-ended stages; and the output circuit coupled to a collector terminal of a second of the differential pair of transistors of the second differential-to-single-ended stage that develops the fixed bias voltage based on a collector current of the second of the differential pair of transistors of the second differential-to-single-ended stage.

16. A temperature compensation circuit, comprising:

first and second matched differential-to-single-ended stages, each including a current mirror and differential pair of transistors with common emitter terminals;

a voltage source applying a reference voltage to a base terminal of a first of the differential pair of transistors of both of the first and second differential-to-single-ended stages;

a temperature independent current sink coupled to the emitter terminals of the differential pair of transistors of the first differential-to-single-ended stage;

a current sink, coupled to the emitter terminals of the differential pair of transistors of the second differential-to-single-ended stage, that sinks current proportional to temperature;

an attenuator input gain control current source applied to a collector terminal of a second of the differential pair of transistors of the first differential-to-single-ended stage;

an amplifier having an input coupled to the collector terminal of the second of the differential pair of transistors of the first differential-to-single-ended stage and an output coupled to a base terminal of a second of the differential pair of transistors of both of the first and second differential-to-single-ended stages; and an output circuit coupled to a collector terminal of a second of the differential pair of transistors of the second differential-to-single-ended stage that develops a fixed bias voltage based on a collector current of the second of the differential pair of transistors of the second differential-to-single-ended stage.

* * * * *